United States Patent
Gurin et al.

(10) Patent No.: US 10,421,659 B2
(45) Date of Patent: Sep. 24, 2019

(54) MEMS SENSOR COMPENSATION FOR OFF-AXIS MOVEMENT

(71) Applicant: InvenSense, Inc., San Jose, CA (US)

(72) Inventors: Ilya Gurin, Mountain View, CA (US); Joseph Seeger, Menlo Park, CA (US); Matthew Thompson, Beaverton, OR (US)

(73) Assignee: InvenSense, Inc., San Jose, CA (US)

( * ) Notice: Subject to any disclaimer, the term of this patent is extended or adjusted under 35 U.S.C. 154(b) by 25 days.

(21) Appl. No.: 15/811,471

(22) Filed: Nov. 13, 2017

(65) Prior Publication Data
US 2019/0144264 A1 May 16, 2019

(51) Int. Cl.
*B81B 3/00* (2006.01)
*B81C 99/00* (2010.01)

(52) U.S. Cl.
CPC .......... *B81B 3/0013* (2013.01); *B81B 3/0008* (2013.01); *B81B 3/0027* (2013.01); *B81C 99/003* (2013.01); *B81B 2201/0235* (2013.01)

(58) Field of Classification Search
CPC .............................. B81C 99/003; B81B 3/0027
See application file for complete search history.

(56) References Cited

U.S. PATENT DOCUMENTS

| 7,520,171 B2 | 4/2009 | Merassi |
| 2005/0092107 A1 | 5/2005 | Eskridge |
| 2005/0132805 A1 | 6/2005 | Park |
| 2014/0007681 A1* | 1/2014 | Lin ..................... G01C 19/5733 73/504.12 |
| 2015/0053001 A1* | 2/2015 | Frey ...................... B81B 3/0027 73/504.12 |
| 2017/0030741 A1 | 2/2017 | Lin |

FOREIGN PATENT DOCUMENTS

EP 1640726 3/2006

OTHER PUBLICATIONS

PCT International Search Report for International Application No. PCT/US2018/055998, dated Jan. 21, 2019 (17 Pages).

* cited by examiner

*Primary Examiner* — Jay C Chang
*Assistant Examiner* — Mikka Liu
(74) *Attorney, Agent, or Firm* — Haley Guiliano LLP; Joshua Van Hoven

(57) ABSTRACT

A microelectromechanical system (MEMS) sensor includes a MEMS layer that includes fixed and movable electrodes. In response to an in-plane linear acceleration, the movable electrodes move with respect to the fixed electrodes, and acceleration is determined based on the resulting change in capacitance. A plurality of auxiliary electrodes are located on a substrate of the MEMS sensor and below the MEMS layer, such that a capacitance between the MEMS layer and the auxiliary loads changes in response to an out-of-plane movement of the MEMS layer or a portion thereof. The MEMS sensor compensates for the acceleration value based on the capacitance sensed by the auxiliary electrodes.

30 Claims, 10 Drawing Sheets

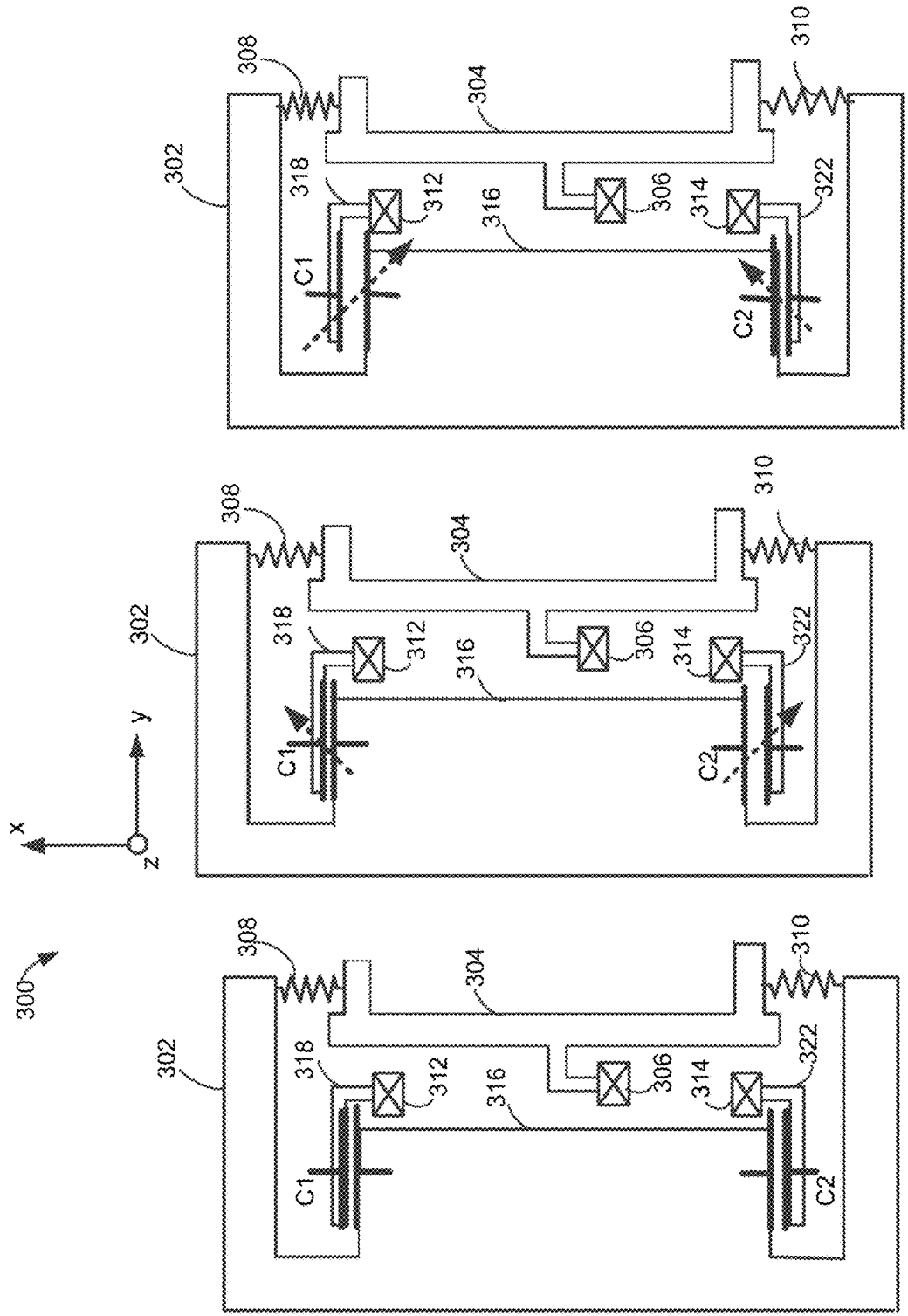

MEMS SENSOR COMPENSATION FOR OFF-AXIS MOVEMENT

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers), angular velocity (e.g., for MEMS gyroscopes), pressure, and magnetic field. The operation of these forces on the movable proof masses may be measured based on the movement of the proof masses in response to the forces. In some implementations, this movement is measured based on distance between the movable proof masses and fixed electrodes, which form capacitors for sensing the movement.

The MEMS sensor may include multiple layers that are manufactured to collectively form the sensor cavity and components, such as a MEMS layer, cap layer, and substrate layer. These layers typically have parallel surfaces with respect to each other. The movable proof masses may be located in the MEMS layer. When fixed electrodes are also located within the MEMS layer, movement of the movable poof masses within the MEMS layer (in-plane movement) relative to the fixed electrodes may be used to measure a force along a plane of the MEMS layer. When fixed electrodes are located on another layer, movement of the movable poof masses outside the plane of the MEMS layer (out-of-plane movement) relative to the fixed electrodes may be used to measure a force out of the plane of the MEMS layer (e.g., perpendicular to the MEMS layer). The MEMS sensors may be designed based on expected relative locations of the movable proof masses and the fixed electrodes, both in the absence of external forces and in response to external forces. If a particular MEMS sensor departs from those expected relative locations due to factors such as manufacturing tolerances or wear, the measurement of the desired force by the sensor may be inaccurate.

SUMMARY OF THE INVENTION

In an embodiment of the present disclosure, a microelectromechanical (MEMS) device comprises a substrate layer having a substrate plane, a MEMS layer including a suspended spring-mass system and having an upper plane and a lower plane, the lower plane being located above the substrate plane, and a plurality of fixed electrodes, wherein each of the plurality of fixed electrodes is at least partially located within the MEMS layer and has an upper plane and a lower plane, wherein the suspended spring-mass system moves relative to the plurality of fixed electrodes in response to a first force in a first direction, wherein the suspended spring-mass system moves relative to the substrate in response to a second force in a second direction, and wherein either the suspended spring-mass system or the plurality of fixed electrodes outputs a sense signal in response to the first force and the second force. In an embodiment, the MEMS device further comprises a plurality of auxiliary electrodes located on the substrate layer facing the lower plane of the suspended spring-mass system or the lower plane of the fixed electrodes, wherein a plurality of auxiliary signals from the auxiliary electrodes provide compensation for the movement in response to the second force, and wherein an output signal representative of the first force is based on the sense signal and the compensation.

In an embodiment of the present disclosure, a microelectromechanical (MEMS) device comprises a plurality of movable electrodes of a MEMS layer and a plurality of fixed electrodes, wherein each of the plurality of movable electrodes is located adjacent to at least one of the plurality of fixed electrodes in at least a portion of the MEMS layer, wherein the movable electrodes move within the MEMS layer relative to the plurality of fixed electrodes in response to a first force in a first direction, wherein the movable electrodes move outside of the MEMS layer in response to a second force in a second direction, wherein the plurality of fixed electrodes or the plurality of movable electrodes output a sense signal in response to at least the first movement, and wherein a first proportional movement in response to a first value of the first force is larger than a second proportional movement in response to a second value of the second force when the first value and the second value are equivalent. In an embodiment, the MEMS device further comprises a plurality of auxiliary electrodes located on a substrate layer facing a lower plane of the movable electrodes or a lower plane of the fixed electrodes, wherein the lower plane of the movable electrodes has moved with respect to a facing surface of the auxiliary electrodes, wherein an auxiliary signal from the auxiliary electrodes provides compensation for the movement, and wherein an output signal representative of the first force is based on the sense signal and the compensation.

In an embodiment of the present disclosure, a method for operating a microelectromechanical (MEMS) device comprises applying one or more first potentials to a plurality of movable electrodes of a MEMS layer, applying one or more second potentials to a plurality of fixed electrodes, wherein each of the plurality of fixed electrodes is located adjacent to at least one of the plurality of movable electrodes in at least a portion of the MEMS layer, wherein the movable electrodes move within the MEMS layer relative to the plurality of fixed electrodes in response to a first force in a first direction, and wherein the movable electrodes move outside of the MEMS layer in relative to a substrate plane facing a lower plane of the MEMS layer in response to a second force in a second direction. In an embodiment, the method further comprises applying one or more third potentials to a plurality of auxiliary electrodes located on the substrate layer, compensating for the second movement due to the second force based on an auxiliary signal from the auxiliary electrodes, and generating an output signal representative of the first force based on the movement in the first direction and the compensation.

BRIEF DESCRIPTION OF THE DRAWINGS

The above and other features of the present disclosure, its nature and various advantages will be more apparent upon consideration of the following detailed description, taken in conjunction with the accompanying drawings in which:

FIG. 3A shows an exemplary depiction of a X-axis accelerometer in the absence of a linear acceleration along the X-axis in accordance with some embodiments of the present disclosure;

FIG. 3B shows an exemplary depiction of a X-axis accelerometer in the presence of a linear acceleration along the negative X-axis in accordance with some embodiments of the present disclosure;

FIG. 3C shows an exemplary depiction of a X-axis accelerometer in the presence of a linear acceleration along the positive X-axis in accordance with some embodiments of the present disclosure;

DETAILED DESCRIPTION

A capacitive MEMS device is constructed of several layers such as a substrate (e.g., CMOS) layer, a MEMS layer, and a cap layer. The MEMS layer includes a movable proof mass and at least one fixed electrode for use in sensing a position or orientation of the proof mass. At least a portion of the proof mass is conductive such that the proof mass and a fixed electrode opposing a planar surface of the proof mass form a capacitor.

An exemplary MEMS device is an accelerometer that is configured to sense a linear acceleration in a particular in-plane direction. The movable proof mass may be a portion of a suspended spring-mass system. The suspended spring-mass system is suspended within the MEMS layer and includes springs, masses, and other similar components to facilitate certain types of motion (e.g., in the desired in-plane sense direction for linear acceleration) and prevent other types of motion in other directions.

The MEMS accelerometer may have fixed electrodes that are also formed within the MEMS layer. Acceleration is sensed based on the in-plane movement of the proof-mass electrodes of the MEMS layer relative to the fixed electrodes. The MEMS accelerometer may also have a plurality of auxiliary electrodes located on the substrate layer. The auxiliary electrodes may be designed and located such that they output a signal that is responsive to a movement of all or a portion of the MEMS layer relative to the substrate layer, or such that they cause the proof mass or fixed electrodes to output such a signal. The sensed signals may be compensated when the auxiliary electrodes sense that the MEMS layer is moved.

Figure 1:
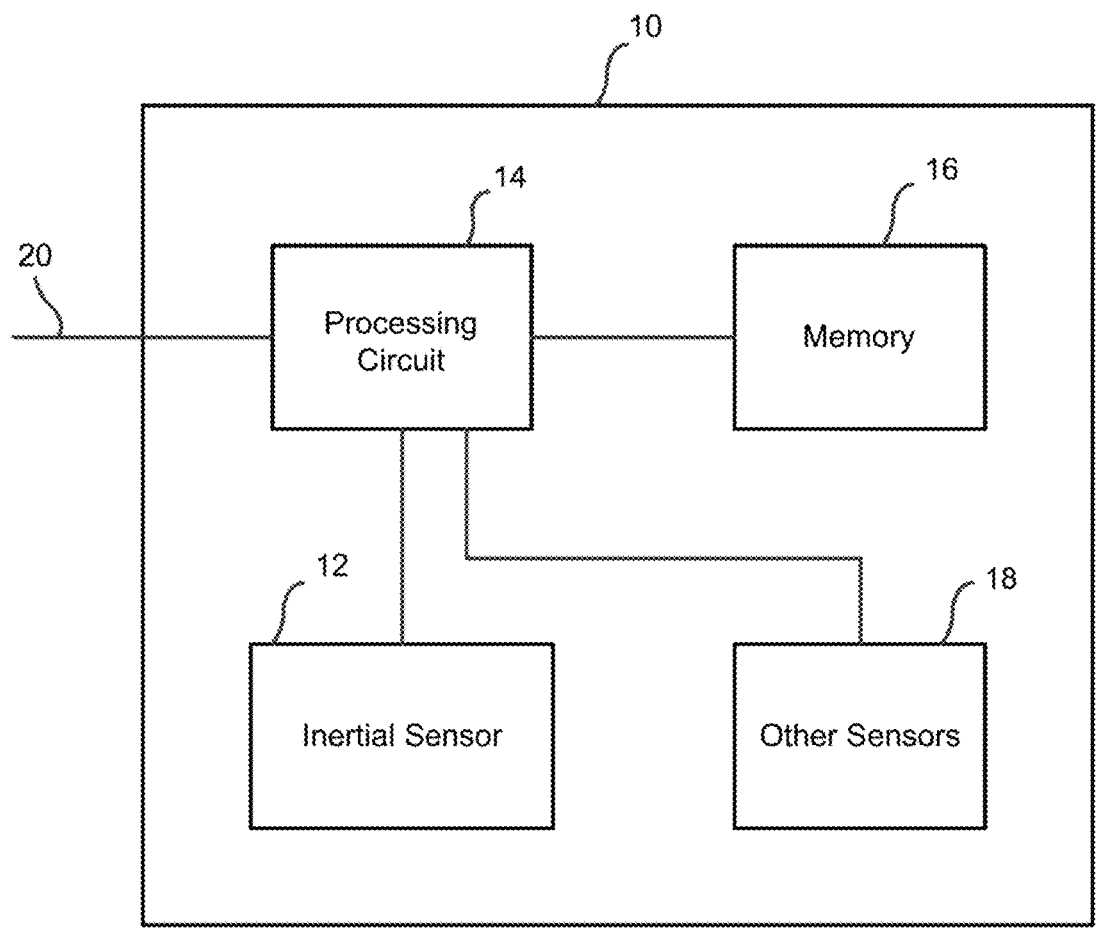
FIG. 1 shows an illustrative motion sensing system in accordance with an embodiment of the present disclosure.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS inertial sensor 12 (e.g., a single or multi-axis accelerometer, a single or multi-axis gyroscope, or a combination thereof) and supporting circuitry, such as processing circuitry 14 and memory 16.

Processing circuitry 14 may include one or more components providing necessary processing based on the requirements of the motion sensing system 10. In some embodiments, processing circuitry 14 may include hardware control logic such as an application-specific integrated circuit that may be integrated within a chip of a sensor (e.g., on a substrate or cap of a MEMS inertial sensor 12 or other sensor 18, or on an adjacent portion of a chip to the MEMS inertial sensor 12 or other sensor 18) to control the operation of the MEMS inertial sensor 12 or other sensor 18 and perform aspects of processing for the MEMS inertial sensor 12 or other sensor 18 according to values stored in the memory 16. In some embodiments, processing circuitry 14 may also include a processor such as a microprocessor that executes software instructions, e.g., that are stored in memory 16. The microprocessor may control the operation of the MEMS inertial sensor 12 by interacting with the hardware control logic, and process signals received from MEMS inertial sensor 12. The microprocessor may interact with other sensors in a similar manner.

Although processing circuitry 14 has been depicted and described as located at motion sensing system 10, and in some embodiments within a MEMS inertial sensor or other sensors 18, in some embodiments (not depicted in FIG. 1), the MEMS inertial sensor 12 or other sensors 18 may communicate directly with external processing circuitry 14 such as a processor or microprocessor (e.g., via a serial bus or direct connection to sensor and control i/o). In an embodiment the processing circuitry 14 of the motion sensing system 10 may process data received from the MEMS inertial sensor 12 and other sensors 18 and communicate with external components and processing (e.g., a microprocessor of external processing circuitry 14) via a communication interface 20 (e.g., a SPI or I2C bus, or in automotive applications, a controller area network (CAN) or Local Interconnect Network (LIN) bus). The processing circuitry 14 may convert signals received from the MEMS inertial sensor 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

An exemplary MEMS inertial sensor (e.g., MEMS inertial sensor 12) may include one or more movable proof masses that are configured in a manner that permits the MEMS inertial sensor (e.g., a MEMS accelerometer or MEMS gyroscope) to measure a desired force (e.g., linear acceleration, angular velocity, etc.) along an axis. In some embodiments, the one or more movable proof masses may be suspended from anchoring points within a MEMS layer. For example, anchoring points may refer to any portion of the MEMS layer which is fixed relative to other layers, such as an anchor that extends from a layer (e.g., a substrate or cap layer) that is parallel to the MEMS layer of the device, a frame of the MEMS layer of the device that is fixedly bonded to a substrate or cap layer, or any other suitable portion of the MEMS device that is fixed relative to the movable proof masses. The proof masses may be arranged in a manner such that they move in response to measured force. The movement of the proof masses relative to a fixed surface (e.g., a fixed electrode extending into the MEMS layer or located parallel to the movable mass on the substrate) in response to the measured force is measured and scaled to determine the desired inertial parameter.

Measurement of an inertial force may be based on designed parameters regarding the initial position of the proof masses relative to the fixed electrodes (e.g., in the absence of an inertial force) as well as the expected relative movement of the proof masses relative to the fixed electrodes in response to inertial forces. In some embodiments, various components that suspend the proof masses within the MEMS layer may be designed to facilitate motion in a particular direction and resist motion in other directions (e.g., with springs that are compliant in a particular direction and stiff in the other directions, or levers that support movement in the particular direction and resist movement in the other directions). In this manner, despite the presence of inertial and other forces in multiple directions (e.g., x-direction, y-direction, z-direction) and due to multiple causes (e.g., linear acceleration, angular velocity, etc.), the proof masses of a MEMS sensor may primarily respond only to certain forces in the directions that are desired for measurement. For example, in a direction that is desired for measurement, the movable proof masses may be suspended such that the response to a particular force in the direction to be measured is larger than the response to a force of the same magnitude in other directions. This ratio of the desired response to the undesired to the same magnitude force may be multiple times greater, and in some designs, well over an order of magnitude greater.

Figure 2A:
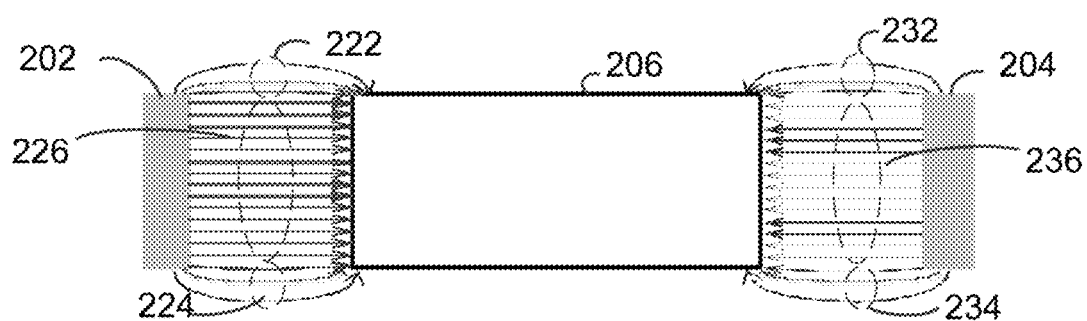
FIG. 2A shows an exemplary depiction of electrostatic fringing between electrodes in accordance with some embodiments of the present disclosure.

FIG. 2A shows an exemplary depiction of electrostatic fringing between electrodes in accordance with some embodiments of the present disclosure. The exemplary embodiment of FIG. 2A depicts two electrodes 202 and 204 having a first potential and a third electrode 206 having a second potential. Although the respective electrode potentials may have a variety of values, in the present embodiment the respective potential difference is demonstrated by the positive (+) and negative (−) indicators on the respective electrodes.

Electrode 206 may form a capacitor with each of electrode 202 and 204, based on the distance between the electrodes, and the respective shapes of the electrodes. In an exemplary embodiment, for ease of demonstration, each of the electrodes 202/204/206 may have rectangular faces in the y-z plane, such that a right-side y-z rectangular face of electrode 202 faces a left-side y-z rectangular face of electrode 206 and a right-side y-z rectangular face of electrode 206 faces a left-side y-z rectangular face of electrode 204. In the exemplary embodiment of FIG. 2A, assuming identical electrode shapes, the capacitance of the capacitor formed by electrodes 202 and 206 may be greater than the capacitor formed by electrodes 204 and 206, based on the relative distances between the electrodes.

FIG. 2A also depicts exemplary electrostatic field lines depicting the electrostatic fields between respective electrodes (e.g., electrostatic field lines 222, 224, and 226 depicting the electrostatic field between electrodes 202 and 206, and electrostatic field lines 232, 234, and 236 depicting the electrostatic field between electrodes 204 and 206). As is depicted in FIG. 2A, at locations where the facing surfaces of the respective electrodes are aligned parallel to each other, the electrostatic field lines are straight (e.g., straight electrostatic field lines 226 between facing surfaces of electrodes 202 and 206, and straight electrostatic field lines 236 between facing surfaces of electrodes 204 and 206). Electrostatic fields also extend between other surfaces, and are curved through free space based on the relative location of the surfaces of the electrodes. For example, electrostatic field lines 222 depict curved electrostatic fields between top corners and top surfaces of electrodes 202 and 206, electrostatic field lines 232 depict curved electrostatic fields between top corners and top surfaces of electrodes 204 and 206, electrostatic field lines 224 depict curved electrostatic fields between bottom corners and bottom surfaces of electrodes 202 and 206, and electrostatic field lines 234 depict electrostatic fields between bottom corners and bottom surfaces of electrodes 202 and 206. In the exemplary embodiment depicted in FIG. 2A, no other components are located within a proximity of the electrodes 202/204/206 to interfere with the electrostatic fields therebetween or to introduce additional electrostatic fields.

Figure 2B:
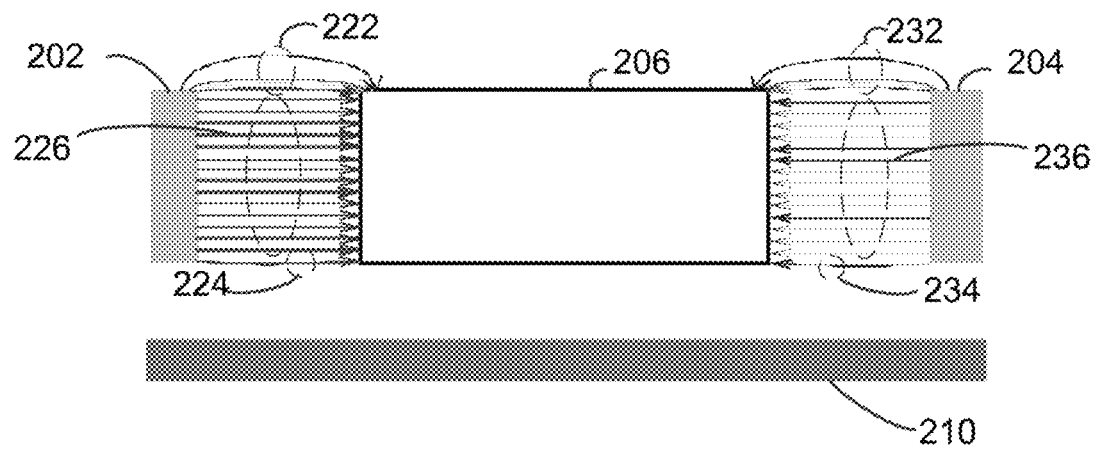
FIG. 2B shows an exemplary depiction of electrostatic fringing between electrodes in the presence of a substrate plane in accordance with some embodiments of the present disclosure.

FIG. 2B shows an exemplary depiction of electrostatic fringing between electrodes in the presence of a substrate plane 210 in accordance with some embodiments of the present disclosure. The electrodes 202/204/206 of FIG. 2B are identical to the electrodes 202/204/206 of FIG. 2A. In FIG. 2B, an additional substrate plane 210 (e.g., an electrostatic shield located on a surface of a substrate layer) is introduced below the electrodes 202/204/206. Although electrodes 202/204/206 and substrate plane 210 may have any suitable shapes and relative location with respect to each other, in an exemplary embodiment each of the bottom surfaces of the electrodes 202/204/206 may form a x-y rectangular face facing towards the top surface of the substrate plane 210 while the substrate plane 210 may have a top x-y rectangular face facing towards the bottom surfaces of the electrodes 202/204/206, such that the top face of the substrate plane is parallel to the bottom surfaces of the electrodes 202/204/206.

In an exemplary embodiment, the substrate plane 210 may have a third potential different than the first and second potentials, for example, ground. The substrate plane 210 is located relatively close to the bottom corners and bottom surfaces of the electrodes 202/204/206. The presence of the substrate plane 210 in such proximity to the electrostatic fields may result in a reduction of the capacitance between the electrodes 202/204/206, which is depicted in FIG. 2B as the removal of one of the electrostatic field lines from each of electrostatic field lines 224 and 234.

Figure 2C:
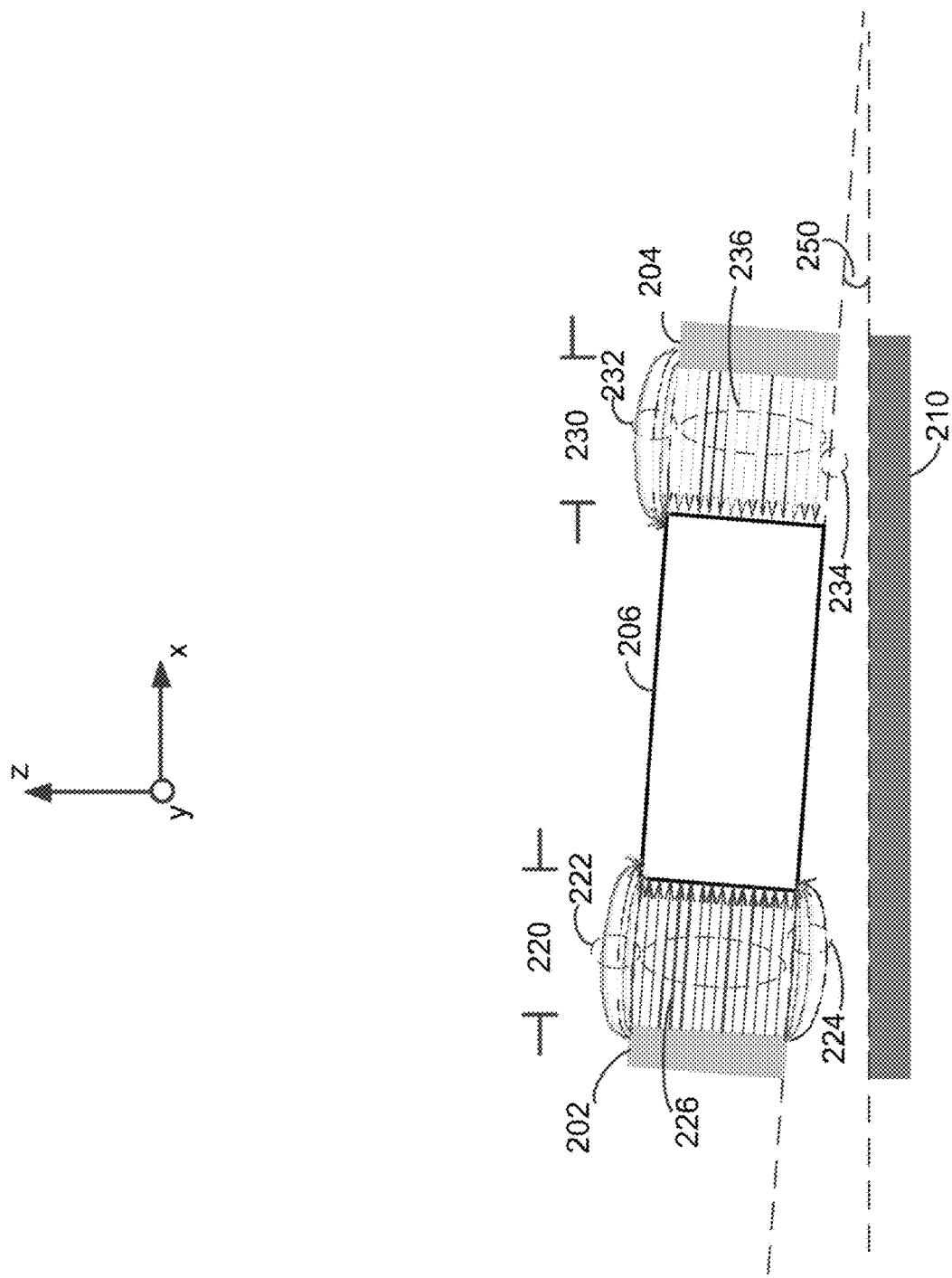
FIG. 2C shows an exemplary depiction of electrostatic fringing between electrodes in the presence of an electrostatic substrate plane and moving in accordance with some embodiments of the present disclosure.

FIG. 2C shows an exemplary depiction of electrostatic fringing between electrodes in the presence of a substrate plane and moving in accordance with some embodiments of the present disclosure. The electrodes 202/204/206 of FIG. 2B are identical to the electrodes 202/204/206 of FIGS. 2A and 2B, and the substrate plane 210 is identical to the substrate plane 210 of FIG. 2B, except that in FIG. 2C the electrodes 202/204/206 are moved at an angle 250 with respect to substrate plane 210.

As a result of the moving of the electrodes, the bottom face of electrode 204 is significantly closer to the substrate plane 210 than is the bottom surface of electrode 202. As a result, the capacitor 230 formed by electrodes 204 and 206 is significantly closer to the substrate plane 210 than is the capacitor 220 formed by electrodes 202 and 206. Unlike FIG. 2B in which the electrostatic fields associated with respective capacitors were impacted similarly by the presence of the substrate plane 210, in the presence of moving in FIG. 2C each of the capacitors is impacted differently. The capacitance of capacitor 220 is increased (e.g., based on additional electrostatic field lines 224 compared to FIG. 2B), whereas that of capacitor 230 is decreased (e.g., based on fewer electrostatic field lines 234 compared to FIG. 2B).

FIG. 3A shows an exemplary depiction of an X-axis accelerometer in the absence of a linear acceleration along the X-axis in accordance with some embodiments of the present disclosure. The accelerometer 300 can employ a proof mass 302 and a support structure 304. The accelerometer 300 can also include a first fixed electrode 318 attached to a first anchor 312 and a second fixed electrode 322 attached to a second anchor 314. The support structure 304 is attached to a third anchor 306. The proof mass 302 can be flexibly attached to the support structure 304 through springs 308 and 310.

According to an embodiment, the accelerometer can comprise multiple capacitors: a first capacitor $C_1$ is formed between an upper portion of fixed electrode 318 and proof-mass electrode 316 and a second capacitor $C_2$ is formed between proof-mass electrode 316 and fixed electrode 322. FIG. 3A illustrates the case of no acceleration and no anchor motion. In this case signals $S_1$ and $S_2$ are associated with capacitors $C_1$ and $C_2$ and can be balanced, for example:

$$S_1 = S_2 = S_a$$

According to the embodiment, the output signal associated with the capacitance is the linear combination of the capacitances $C_1$ and $C_2$. For example, the output capacitive signal Soutput can be of the form:

$$S_{output} = S_1 - S_2$$

Therefore, in the example case of no acceleration and no anchor motion, and identical capacitances (a) and signals (a):

$$S_{output} = S_1 - S_2 = S_a - S_a = 0.$$

FIG. 3B shows an exemplary depiction of an X-axis accelerometer in the presence of a linear acceleration along the negative X-axis in accordance with some embodiments of the present disclosure. The accelerometer 300 is sensitive to acceleration in the X-direction. As illustrated in FIG. 3B, in the event of X-axis acceleration acting along the negative X direction, the proof mass 302 experiences an inertial force in the positive X direction and, being flexibly attached to the support structure 304, moves in the positive X direction. In contrast, the fixed electrodes 318 and 322 are rigidly attached to the respective anchors 312 and 314, and therefore do not substantially move under acceleration. As a result, the capacitance $C_1$ increases while the capacitance $C_2$ decreases. This results in a corresponding increase in signal $S_1$ and decrease in signal $S_2$. The resulting output signal is proportional to the linear acceleration along the negative x-axis, with a change in capacitance ($\Delta_a$) corresponding to a change in signals ($\Delta$)

$$S_{output} = S_1 - S_2 = (S_a + \Delta) - (S_a - \Delta) = 2\Delta.$$

FIG. 3C shows an exemplary depiction of an X-axis accelerometer in the presence of a linear acceleration along the positive X-axis in accordance with some embodiments of the present disclosure. As illustrated in FIG. 3C, in the event of X-axis acceleration acting along the positive X direction, the proof mass 302 experiences an inertial force in the negative X direction and, being flexibly attached to the support structure 304, moves in the negative X direction. In contrast, the fixed electrodes 318 and 322 are rigidly attached to the respective anchors 312 and 314, and therefore do not substantially move under acceleration. As a result, the capacitance $C_2$ increases while the capacitance $C_1$ decreases. This results in a corresponding increase in signal $S_2$ and decrease in signal $S_1$. The resulting output signal is proportional to the linear acceleration along the negative x-axis, with a change in capacitance ($\Delta$) corresponding to a change in signals ($\Delta$):

$$S_{output} = S_1 - S_2 = (S_a - \Delta) - (S_a + \Delta) = -2\Delta.$$

Figure 4A:
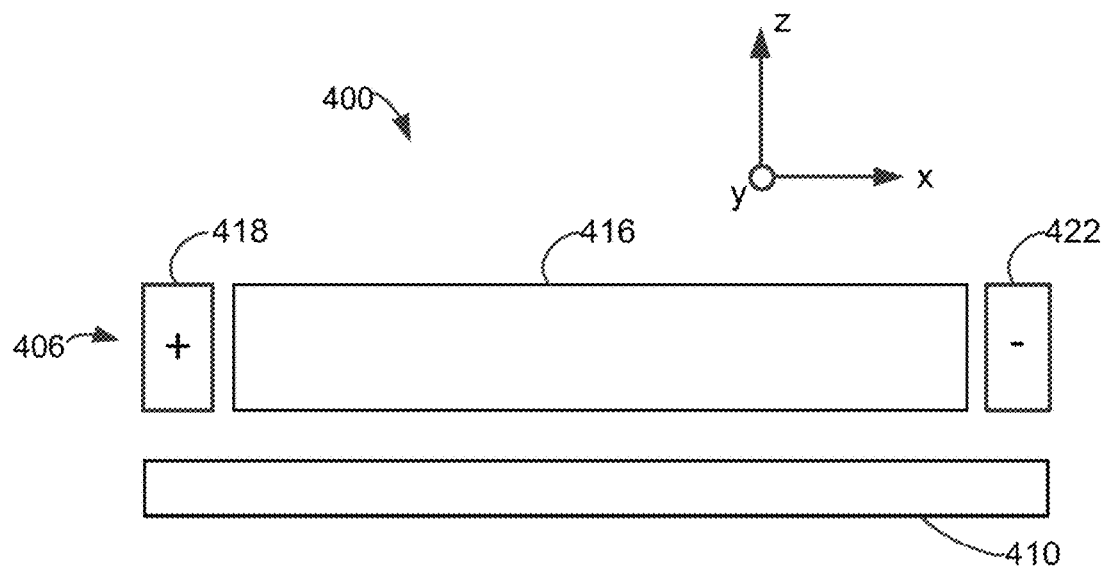
FIG. 4A shows an exemplary section view of the X-axis accelerometer of FIG. 3A in accordance with some embodiments of the present disclosure.

FIG. 4A shows an exemplary section view of an accelerometer similar to accelerometer 400 of FIG. 3 in accordance with some embodiments of the present disclosure (e.g., for ease of illustration the upper and lower arms of proof mass 302 and support structure 304 are omitted from FIG. 4A, and the cap, substrate, and anchors are not depicted). Although particular components are depicted and configured in a particular manner in FIG. 4A, it will be understood that accelerometer 400 may include other suitable components and configurations. The section view of FIG. 4A depicts a limited subset of components of accelerometer 400, which generally includes a spring-mass system within a MEMS layer including various components such as springs, proof masses, coupling masses, lever arms, couplings, and other suitable electromechanical components that are manufactured using semiconductor manufacturing techniques.

The set of components depicted in FIG. 4A provide a configuration for in-plane capacitive sensing along an axis. Although not depicted in detail in FIGS. 4A-6, springs, anchors, flexures, masses, and other components may be configured to facilitate motion along the in-plane axis that is being sensed (e.g., by being flexible along that axis) while limiting motion along other axes (e.g., by being rigid along said axes).

In the embodiment of FIG. 4A, the accelerometer 400 is constructed of a plurality of bonded layers. Although a MEMS device may be constructed in a variety of manners, in an embodiment, the MEMS device may include a MEMS layer 406 and a substrate layer 410 (e.g., including a shield layer located on an upper surface of a substrate) which may be bonded (e.g., to a cap layer, bonding not depicted in FIGS. 4A-6) to form a hermetically sealed package. The substrate layer 410 may include CMOS circuitry and form a CMOS layer of the MEMS device, though the CMOS circuitry may reside in other portions of the device, such as a cap layer, or in some embodiments, external to the MEMS die. An exemplary MEMS layer may be produced using semiconductor manufacturing techniques to construct micromechanical components for use in applications such as MEMS sensors (e.g., accelerometers, gyroscopes, pressure sensors, microphones, etc.). An exemplary CMOS layer may provide for the integration of electrical components and devices within the CMOS layer, and may also provide for interconnections between those components. In some embodiments, the components of the MEMS layer 406 may be conductive, and interconnections between components of the MEMS layer 406 and processing circuitry such as CMOS portions of the substrate may be provided. As an example, circuitry within the MEMS layer 406 may electrically couple electrical components (e.g., fixed electrodes or movable proof masses) of the MEMS layer 406 to processing circuitry 14 or other electrical components.

In an exemplary embodiment, the MEMS layer may include a suspended spring-mass system including a proof-mass electrode 416, which may generally correspond to proof-mass electrode 316 of FIG. 3. Fixed electrode 418 may generally correspond to fixed electrode 318, and fixed electrode 422 may generally correspond to fixed electrode 322.

The exemplary accelerometer 400 may operate as an x-axis accelerometer according to the axes shown in the figure. Fixed electrode 418 is labeled with a positive (+) sign to indicate a first input to a differential capacitance sensing circuit (e.g., provided to processing circuitry) and fixed electrode 422 is labeled with a negative (−) sign to indicate a second input to a differential capacitance sensing circuit (e.g., provided to the processing circuitry). In response to a positive x-axis linear acceleration imparted upon the accelerometer 400 the proof-mass electrode 416 may move in the negative x-direction along the x-axis, resulting a relative increase in the capacitance sensed by fixed electrode 418 and a relative decrease in the capacitance sensed by fixed electrode 422. The resulting differential output signal may be proportional to the magnitude of the linear acceleration along the positive x-axis. In response to a negative x-axis linear acceleration, proof-mass electrode 416 may move in the positive x-direction along the x-axis, resulting a relative decrease in the capacitance sensed by fixed electrode 418 and a relative increase in the capacitance sensed by fixed electrode 422. The resulting differential output signal may be proportional to the magnitude of the linear acceleration along the negative x-axis.

FIG. 4A also depicts a substrate layer 410 (e.g., an electrode shield layer) formed to face the lower plane of MEMS layer 406, and corresponding to the substrate plane 210 from FIGS. 2B and 2C. The substrate layer 410 may be located below the MEMS layer 406 and parallel to a lower surface of the MEMS layer. Thus, under normal conditions the substrate layer 410 forms a planar surface parallel to the bottom planar surfaces of the MEMS layer 406 (e.g., the bottom planar surfaces of proof-mass electrode 416 and the bottom planar surfaces of fixed electrodes 418 and 422). In an embodiment, the substrate layer 410 is at a different potential than either the proof-mass electrodes or the fixed electrodes, and in an exemplary embodiment, may be at ground.

Figure 4B:
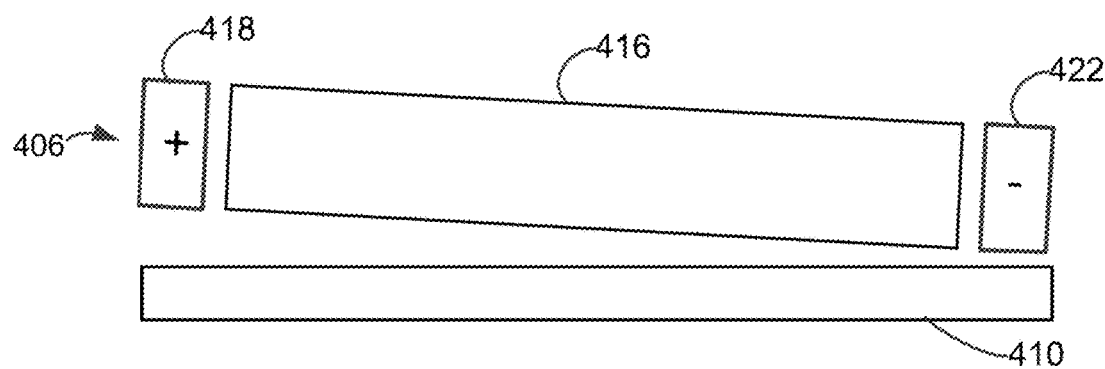
FIG. 4B shows an exemplary section view of the X-axis accelerometer of FIG. 3A experiencing a moving of a MEMS layer in accordance with some embodiments of the present disclosure.

FIG. 4B shows an exemplary section view of the X-axis accelerometer of FIG. 4A experiencing a moving of an entire MEMS layer in accordance with some embodiments of the present disclosure. As a result of causes such as variations and tolerances in manufacturing processes, stresses placed on the MEMS sensor during assembly with other components, or exposure to extreme conditions during operation, the MEMS layer 406 may not be aligned with the other layers of the MEMS sensor, such that the lower surfaces of the electrodes 416, 418, and 422, are no longer parallel with the upper surface of the substrate plane 410.

FIG. 4B depicts a movement about the Y-axis, which for demonstrative purposes, may be emphasized within FIG. 4B. Although only a Y-axis rotation is depicted in FIG. 4B, it will be understood that a MEMS device layer may have other axes that are rotated, and in some instances, multiple axes may be rotated within a single MEMS sensor. A rotation about the X-axis or Y-axis may result in the MEMS device layer 404 being located out-of-plane as compared to an ideal (i.e., parallel) alignment (a Z-axis rotation may result in the MEMS device layer being rotated within the plane of the MEMS device layer, and may result in misalignment of the MEMS device layer with respect to underlying electrodes, anchors, and other similar components that interface with the MEMS device layer).

As is depicted in FIG. 4B, as a result of the movement of the MEMS layer 406 the lower surface of the proof-mass electrode 416 and each of the fixed electrodes 418 and 422 is no longer parallel with the upper surface of the substrate layer 410. As a described in FIGS. 2A and 2C, this movement may modify the electrostatic fields between respective electrodes, and therefore modify the capacitance of each capacitor formed by the respective electrodes. In the embodiment of FIG. 4B, the interior faces of each of the electrodes remain aligned (e.g., the interior faces of each electrode within the Y-Z-plane) but the presence of the substrate layer 410 modifies the capacitance of each respective capacitor. Because it is farther from the substrate layer 410 than under normal (parallel plane) operating conditions, the capacitance of $C_1$ (e.g., between fixed electrode 418 and movable electrode 416) will increase. The increase is greatest where the capacitor is farther from the substrate layer 410. Because it is closer to the substrate layer 410 than under normal (parallel plane) operating conditions, the capacitance of $C_2$ (e.g., between movable electrode 416 and fixed electrode 422) will decrease. The decrease is greatest where the capacitor is nearest to the substrate layer 410.

Even in the absence of X-axis acceleration, the overall capacitance associated with fixed electrode 418 will increase while the overall capacitance associated with fixed electrode 422 will decrease, which results in a corresponding differential signal provided to the sense circuitry. This differential signal is similar to that normally produced in response to X-axis acceleration. In response to this differential signal caused by movement, the sense circuitry will output a signal indicating acceleration along the negative X-axis. The magnitude of this apparent acceleration (e.g., "movement error") increases with a larger movement, and decreases with a smaller movement.

In the presence of linear acceleration along the X-axis, the capacitances of each of the capacitors will change based on the relative locations of the proof masses and the electrodes within the MEMS layer. However, the actual capacitances that are sensed by the sense circuitry and processing circuitry of the accelerometer will still experience a movement error that is proportional to the movement.

Figure 4C:
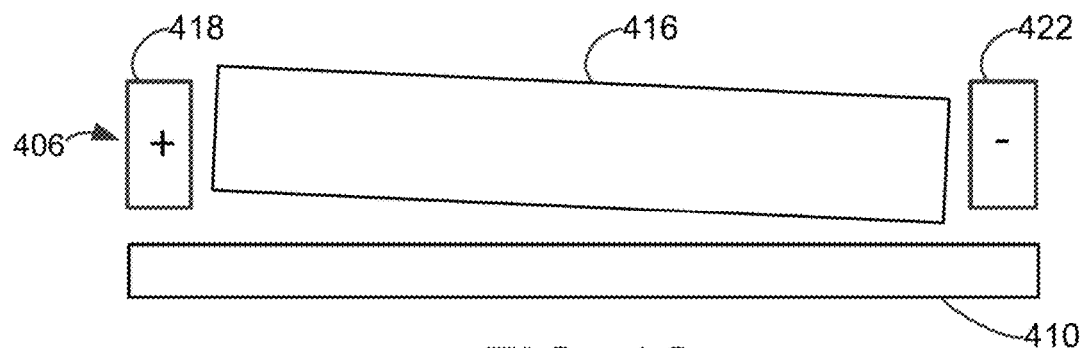
FIG. 4C shows an exemplary section view of the X-axis accelerometer of FIG. 3A experiencing a moving of a suspended portion of a MEMS layer in accordance with some embodiments of the present disclosure.

FIG. 4C shows an exemplary section view of the X-axis accelerometer of FIG. 4A experiencing a moving of a suspended spring-mass structure of a MEMS layer in accordance with some embodiments of the present disclosure. In some instances, a variety of factors such as variations and tolerances in manufacturing processes, stresses placed on the MEMS sensor during assembly with other components, exposure to extreme conditions during operation, or normal wear of a sensor over time may cause the suspended spring mass system to become misaligned with the MEMS layer 406. That is, while the fixed components of MEMS layer 406 remain properly aligned with the other components of the sensor (e.g., the upper surfaces of the fixed portions of the MEMS layer 406 are aligned with the lower surface of the cap and the lower surfaces of the fixed portions of the MEMS layer 406 are aligned with the upper surface of the substrate layer 410), the components of the suspended spring-mass portion of the MEMS layer 406 not be properly aligned (e.g., the upper surface of the proof-mass electrode 416 of the MEMS layer 406 is at an angle with respect to the lower surface of the cap and the lower surface of the proof-mass electrode 416 is at an angle with respect to the upper surface of the substrate layer 410).

FIG. 4C depicts a movement of the suspended spring-mass system about the Y-axis, which for demonstrative purposes, may be emphasized within FIG. 4C. It will be appreciated that although FIGS. 4B and 4C show two specific movement configurations of the proof mass and fixed electrodes, and that other configurations are possible.

As is depicted in FIG. 4C, as a result of the movement of the suspended spring-mass system the lower surface of the proof-mass electrode 416 is no longer parallel with the upper surface of the substrate layer 410. As a described in FIG. 2C, this movement may modify the electrostatic fields between respective electrodes, and therefore modify the capacitance of each capacitor formed by the respective electrodes. Because it is farther from the substrate layer 410 than under normal (parallel plane) operating conditions, the capacitance of $C_1$ (e.g., fixed electrode of 418 and movable electrode 416) will increase. The increase is greatest where the capacitor is farther from the substrate layer 410. Because it closer to the substrate layer 410 than under normal (parallel plane) operating conditions, the capacitance of $C_2$ (movable electrode 416 and fixed electrode 422) will decrease. The decrease is greatest where the capacitor is farther from the substrate layer 410.

In the embodiment of FIG. 4C, the interior faces of the proof-mass electrodes 416 are no longer aligned within the Y-Z plane and thus are no longer parallel to the interior faces of the fixed electrodes 418 and 422. A greater misalignment due to the movement of the suspended spring-mass system results in a reduced capacitance between electrodes, which is in addition to the changes in capacitance caused by the substrate layer. In the embodiment of FIG. 4C, both of the capacitances are reduced due to misalignment between electrodes. The misalignment between the proof-mass electrode and the fixed electrodes 418 and 422 also reduces the sensitivity to linear acceleration, i.e., the change in capacitance due to a particular magnitude of acceleration is less than normal conditions. Various scaling factors and parameters for calculating linear acceleration as well as sensor fusion outputs may be inaccurate as a result of this reduced sensitivity.

Even in the absence of X-axis acceleration, the overall capacitance associated with fixed electrode 418 will change based on the relative increase in capacitance as a result of the increased distance of the proof-mass electrode 416-416 from substrate layer 410 and the relative decrease in capacitance due to misalignment with the proof-mass electrode. The overall capacitance associated with fixed electrode 422 will decrease based on the relative decrease in capacitance as a result of the reduced distance of the proof-mass electrode 416 from substrate layer 410 as well as the relative decrease in capacitance due to misalignment with the proof-mass electrode. Because the fixed electrodes 418 and 422 experience different changes in capacitance due to the movement of the suspended spring-mass system, the sense circuitry will output a signal (e.g., a movement error signal) indicating acceleration along the negative X-axis even in the absence of linear acceleration along the X-axis.

In the presence of linear acceleration along the X-axis, the capacitances of each of the capacitors will change based on the relative location of the electrodes within the MEMS layer. Because different capacitors experience different degrees of misalignment, the change in capacitance for each capacitor due to linear acceleration may differ for different capacitors.

Figure 5:
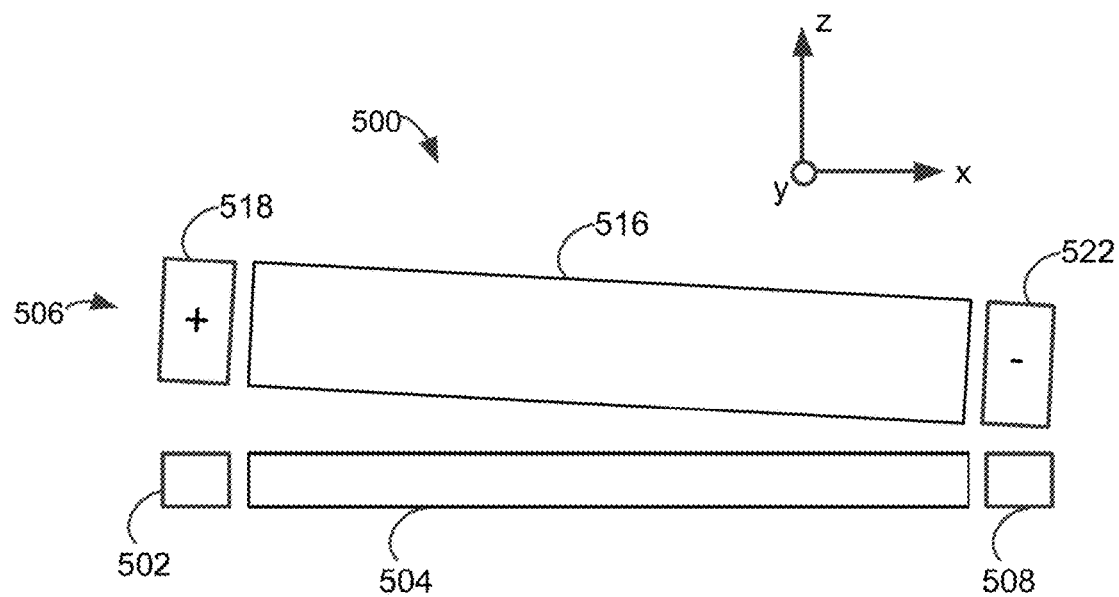
FIG. 5 shows an exemplary section view of the X-axis accelerometer of FIG. 4A including two auxiliary electrodes for movement compensation in accordance with some embodiments of the present disclosure.

FIG. 5 shows an exemplary section view of the X-axis accelerometer of FIGS. 4A-4C including two auxiliary electrodes for movement compensation in accordance with some embodiments of the present disclosure. In the exemplary embodiment of FIG. 5, the entire MEMS layer 506 is moved about the Y-axis to form an angle with respect to the substrate layer 510 (e.g., similar to FIG. 4B). However, the auxiliary electrodes of FIG. 5 may also be utilized for other movement scenarios such as movement about multiple axes or moving of only a portion of the MEMS layer 506 (e.g., movement of only the suspended spring-mass system).

Auxiliary electrodes may be located on a surface of the MEMS sensor that forms an angle with one or more surfaces of one or more components within the MEMS layer 506 when the one or more components are moved. Although exemplary auxiliary electrodes 502 and 508 are depicted as being located on an upper surface of a substrate below a lower surface of MEMS layer 506, auxiliary electrodes may be placed on any surface (e.g. lower surface of a cap layer) at any location that is responsive to out of plane movement of a component of interest within the MEMS layer.

Auxiliary electrode 502 may a have a potential and may form a capacitor $C_3$ with fixed electrode 518, while auxiliary electrode 508 may have a potential and may form a capacitor $C_4$ with fixed electrode 522. In some embodiments, output signals $S_3$ and $S_4$ may be provided as differential signals to sense circuitry. In the absence of out-of-plane movement of the fixed electrodes 518 and 522, the capacitances $C_3$ and $C_4$ and signals $S_3$ and $S_4$ may be equal. If fixed electrodes 518 and 522 are moved about the Y-axis as depicted in FIG. 5, the capacitance of $C_3$ may decrease while the capacitance of $C_4$ may increase. The resulting auxiliary signals $S_3$ and $S_4$ may be utilized to assess the movement and compensate for the movement, either individually (as auxiliary signals $S_3$ and $S_3$) or as a differential auxiliary signal (based on the difference between $S_3$ and $S_4$).

In some embodiments, compensation may be performed by analog or digital modification of sensed acceleration signals, by software that performs compensation, by directly modifying the sensed capacitances associated with the acceleration signals, or any suitable combination thereof. In an exemplary embodiment of analog or digital modification of sensed acceleration signals, the MEMS layer sensor components (e.g., fixed electrodes 518 and 522 and/or proof-mass electrode 516) may output a signal that is representative of the overall capacitance of the electrodes (e.g., fixed electrodes 518 and 522). In some embodiments, circuitry such as amplifiers and adders may modify each of the capacitance signals individually based on an individual auxiliary signal or a differential auxiliary signal. In some embodiments, the circuitry may modify the differential output signal (e.g., determined from signals output from fixed electrodes 518 and 522) based on the differential auxiliary signal. In some embodiments, such modifications may be based on known scaling factors between expected auxiliary electrode output signals and movement effects on sense capacitance.

In an exemplary embodiment of software compensation, the sense signals and auxiliary signals, individually and/or as differential signals, may be provided to processing circuitry 14 which may execute instructions to compensate for the movement of one or more components within the MEMS sensor layer.

In the embodiment of FIG. 5, the capacitance $C_3$ decreases as the movement increases, due to the movement of a portion of fixed electrode 518 away from auxiliary electrode 502. This decrease in capacitance may counteract the increase in capacitance of the capacitor of fixed electrode 518 with proof-mass electrode 516 (e.g., which is now farther away from the substrate layer 510). By sizing the auxiliary electrode 502 appropriately, the increase in capacitance experienced by the capacitor of fixed electrode 518 and proof-mass electrode 516 may be eliminated based on the decreased capacitance of capacitor $C_3$ between fixed electrode 518 and auxiliary electrode 502. In the embodiment of FIG. 5, the capacitance $C_4$ increases as the movement increases, due to the movement of a fixed electrode 522 towards auxiliary electrode 508. This increase in capacitance may counteract the decrease in capacitance of the other capacitor of fixed electrode 522 and proof-mass electrode 516 (e.g., which is closer to the substrate layer 510). By sizing the auxiliary electrode 508 appropriately, the decrease in capacitance experienced by fixed electrode 522 and proof-mass electrode 516 may be eliminated based on the increased capacitance of capacitor $C_4$ between fixed electrode 522 and auxiliary electrode 508.

Figure 6:
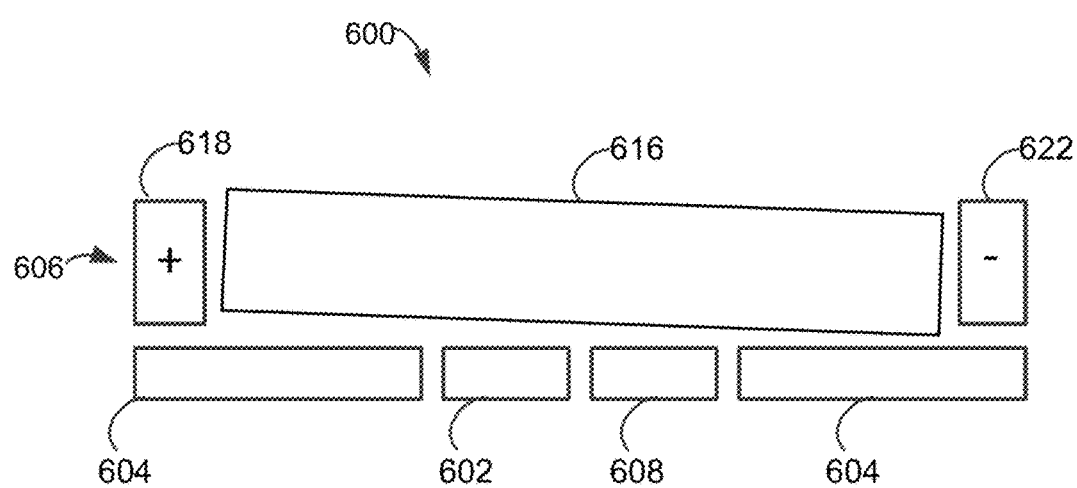
FIG. 6 shows an exemplary section view of the X-axis accelerometer of FIG. 4A including four auxiliary electrodes in accordance with some embodiments of the present disclosure.

Auxiliary electrodes may be placed in multiple suitable locations to create capacitors with one or more components of MEMS layer in a manner to identify movement of the components and, in some embodiments, perform compensation for the component movement. As another example of such an embodiment, FIG. 6 shows an exemplary section view of the X-axis accelerometer of FIGS. 4A-4C including auxiliary electrodes 602 and 608 located below the proof-mass electrode 616 (e.g., which corresponds to proof-mass electrodes 416 and 516). In the embodiment of FIG. 6, only movement of the suspended spring-mass system of the accelerometer of the MEMS layer 606 is depicted, although it will be understood that the configuration of FIG. 6 is also operational to perform measurement and compensation for movement of the entire MEMS layer 606.

Auxiliary electrode 602 may a have a potential and may form a capacitor $C_3$ with a negative x-axis portion of proof-mass electrode 616 and auxiliary electrode 608 may have a potential and may form a capacitor $C_4$ with a positive x-axis portion of proof-mass electrode 616. In the exemplary embodiment of FIG. 6, values of each of capacitors $C_3$ and $C_4$ are based on the movement of the suspended spring-mass system. In the embodiment of FIG. 6, the capacitance $C_3$ decreases as the movement increases, due to the movement of the portion of proof-mass electrode 616 away from auxiliary electrode 602. This decrease in capacitance may counteract the increase in capacitance of the capacitor of fixed electrode 618 with proof-mass electrode 616 (e.g., which is now farther away from the substrate layer 610). By sizing the auxiliary electrode 602 appropriately, the increase in capacitance experienced by the capacitor of fixed electrode 618 and proof-mass electrode 616 may be eliminated based on the decreased capacitance of capacitor $C_3$ between proof-mass electrode 616 and auxiliary electrode 602. In the embodiment of FIG. 6, the capacitance $C_4$ increases as the movement increases, due to the movement of the portion of proof-mass electrode 616 towards auxiliary electrode 608. This increase in capacitance may counteract the decrease in capacitance of the other capacitor of fixed electrode 622 and proof-mass electrode 616 (e.g., which is closer to the substrate layer 510). By sizing the auxiliary electrode 608 appropriately, the decrease in capacitance experienced by fixed electrode 522 and proof-mass electrode 516 may be eliminated based on the increased capacitance of capacitor $C_4$ between the portion of proof-mass electrode 616 and auxiliary electrode 608.

In some embodiments (not depicted in FIGS. 5 and 6), auxiliary electrodes could be placed at multiple locations (e.g., under fixed electrodes and proof-mass electrodes) and/or auxiliary electrodes may be located between multiple electrodes. Based on a comparison of the change in capacitance of each of the capacitors, it may therefore be possible to determine whether only the suspended spring-mass system is moved or if the entire MEMS layer is moved. In some embodiments, alarms, notifications, and warnings may be provided based on the type of movement or severity thereof. In some embodiments, the compensation procedures and methods may be changed based on the type of movement, for example, to take into account that the electrodes are misaligned within the MEMS layer when only the suspended spring-mass system is moved. In an exemplary embodiment, some of the auxiliary electrodes may also function as compensation electrodes that are used to modify the sensed capacitance from the movement of the proof mass and fixed electrodes.

Figure 7:
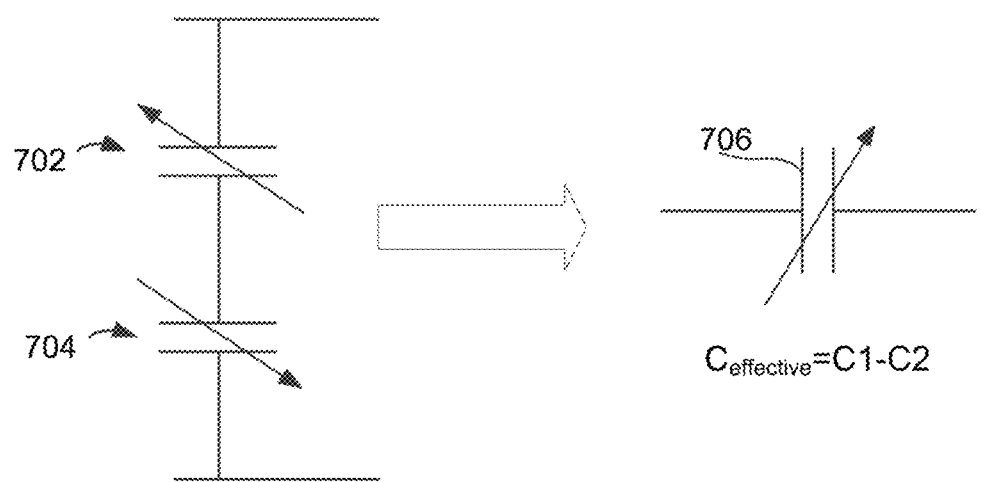
FIG. 7 depicts an exemplary effective capacitance in accordance with some embodiments of the present disclosure.

FIG. 7 depicts an exemplary effective capacitance of differential capacitance sensing in accordance with some embodiments of the present disclosure. Although it will be understood that differential capacitors may be coupled and configured in a variety of manners, and that any suitable number of capacitors may be configured in a differential configuration, in an embodiment the capacitor 702 may correspond to a first capacitor $C_1$ (e.g., of FIGS. 3-6) and capacitor 704 may correspond to a second capacitor $C_2$ (e.g., of FIGS. 3-6). Sense signals that are generated (e.g., from proof masses or fixed electrodes) may be logically or physically combined to arrive at a value for a differential capacitor $C_{effective}$ having an effective capacitance (e.g., as described for FIGS. 3-6). As described above, in the absence of relative movement between proof mass electrodes and fixed electrodes, the capacitances may cancel, resulting in a $C_{effective}$ having a capacitance of zero. Relative movement results in a change of the capacitances (e.g., as described in the context of FIGS. 3-6, a proportion positive and negative change in capacitance) which results in an increase in a capacitance of $C_{effective}$ that is proportional to the amount of movement.

Figure 8:
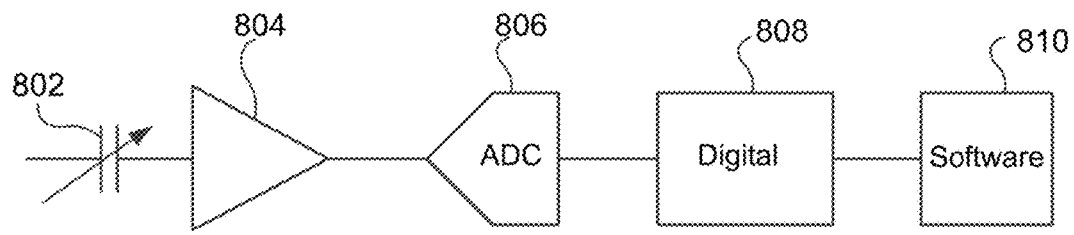
FIG. 8 depicts exemplary processing circuitry for measuring acceleration in accordance with some embodiments of the present disclosure.

FIG. 8 depicts exemplary processing circuitry for performing measurement in accordance with some embodiments of the present disclosure. In the embodiment of FIG. 8, a differential capacitor 802 (e.g., capacitor 706 of FIG. 7) has an effective capacitance that is proportional to the movement of one or more proof mass electrodes relative to one or more fixed electrodes in response to an inertial force (e.g., linear acceleration) that is being measured. The differential capacitor 802 output is provided to an amplifier such as a capacitance to voltage (C2V) circuit 804, which may provide scaling and amplification, and outputs a signal (e.g., a current or voltage) that is proportional to the effective capacitance of the differential capacitor 802 output. The C2V output may be provided to analog-to-digital converter (ADC) 806, which outputs digital data to digital circuitry 808 that corresponds to the analog value output by C2V circuit 804, which in turn corresponds to effective capacitance of differential capacitor 802, which in turn corresponds to the movement of the one or more proof mass electrodes relative to the fixed electrodes in response to linear acceleration. The digital circuitry 808 may perform functions such as scaling and analysis to output linear acceleration or parameters that may be derived from linear acceleration, which output may be provided to software 810 for further analysis, such as further scaling and analysis.

Figure 9:
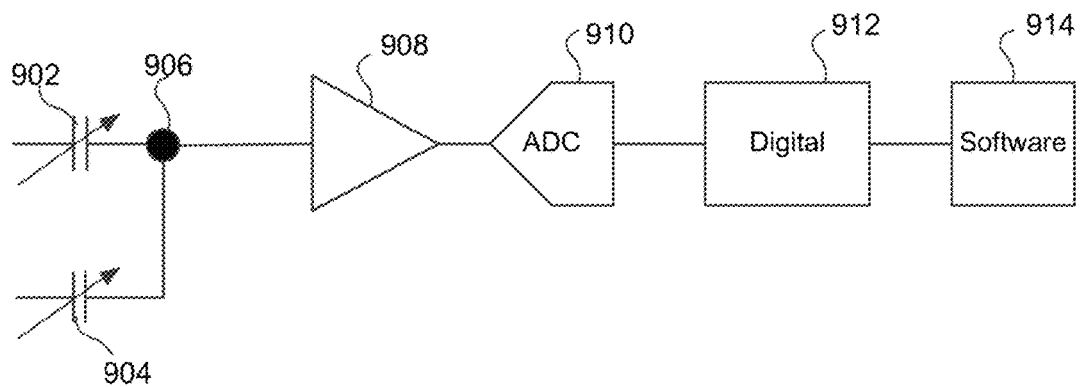
FIG. 9 depicts exemplary processing circuitry for a performing movement compensation in accordance with some embodiments of the present disclosure.

FIG. 9 depicts exemplary processing circuitry for performing movement compensation in accordance with some embodiments of the present disclosure. In the embodiment of FIG. 9, a sensing differential capacitor 902 (e.g., capacitor 706 of FIG. 7) has an effective capacitance that is proportional to the movement of one or more proof mass electrodes relative to one or more fixed electrodes in response to an inertial force (e.g., linear acceleration) that is desired to be measured. A compensation differential capacitor 904 (e.g., capacitor 706 of FIG. 7) has an effective capacitance that is proportional to the movement of one or more portions of a MEMS layer (e.g., proof mass electrodes and/or fixed electrodes) relative to one or more auxiliary electrodes (e.g., out-of-plane movement relative to auxiliary electrodes located on a substrate plane). The sense differential capacitor 902 output and the compensation differential capacitor 904 output are electrically combined (e.g., by a direct electrical connection) at node 906, thus providing a combined differential output signal that is proportional to the movement of the proof mass electrodes relative to the fixed electrodes, with effects due to out-of-plane movement electrically removed. The combined differential output signal is provided from node 906 to C2V circuit 908, which may provide scaling and amplification, and outputs a signal (e.g., a current or voltage) that is proportional to the effective capacitance of the combined differential output signal. The C2V output may be provided to analog-to-digital converter 910, which outputs digital data to digital circuitry 912 that corresponds to the analog value output by C2V circuit 908, which in turn corresponds to the combined differential capacitance, which in turn corresponds to the movement of the one or more proof mass electrodes relative to the fixed electrodes in response to linear acceleration with compensation for out-of-plane movement. The digital circuitry 912 may perform functions such as scaling and analysis to output linear acceleration or parameters that may be derived from linear acceleration, which output may be provided to software 914 for further analysis, such as further scaling and analysis.

Figure 10:
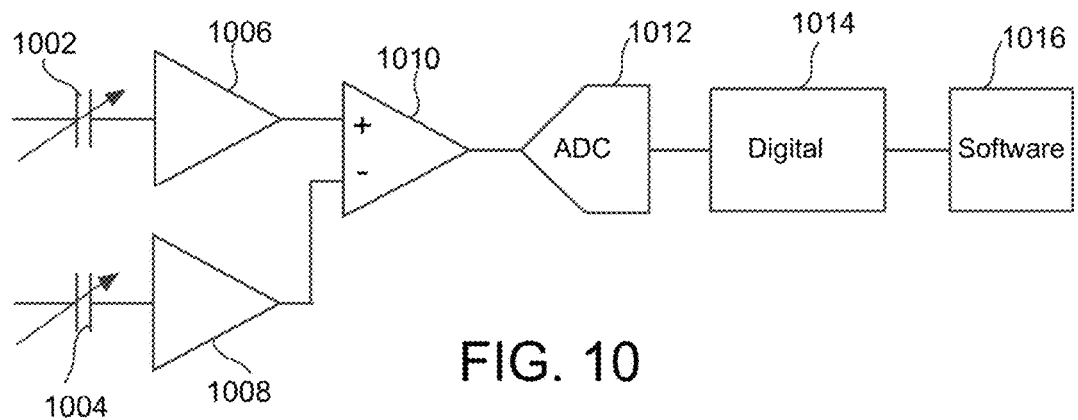
FIG. 10 depicts exemplary processing circuitry for performing movement compensation in accordance with some embodiments of the present disclosure.

FIG. 10 depicts exemplary processing circuitry for performing movement compensation in accordance with some embodiments of the present disclosure. In the embodiment of FIG. 10, a sensing differential capacitor 1002 output has an effective capacitance that is proportional to the movement of one or more proof mass electrodes relative to one or more fixed electrodes in response to an inertial force (e.g., linear acceleration) that is desired to be measured. A compensation differential capacitor 1004 output has an effective capacitance that is proportional to the movement of one or more portions of a MEMS layer (e.g., proof mass electrodes and/or fixed electrodes) relative to one or more auxiliary electrodes (e.g., out-of-plane movement relative to auxiliary electrodes located on a substrate plane). The sense differential capacitor 1002 output is provided to C2V circuit 1006, which may provide scaling and amplification, and outputs a signal (e.g., a current or voltage) that is proportional to the effective capacitance of the sense differential output signal. The compensation differential capacitor 1004 output is provided to C2V circuit 1008, which may provide scaling and amplification, and outputs a signal (e.g., a current or voltage) that is proportional to the effective capacitance of the compensation differential output signal. The outputs of C2V circuit 1006 and C2V circuit 1008 are provided to amplifier 1010, which performs subtraction and scaling functions, thus providing a combined differential output signal that is proportional to the movement of the proof mass electrodes relative to the fixed electrodes, with effects due to out-of-plane movement electrically removed. The amplifier 1010 output may be provided to analog to digital converter 1012, which outputs digital data to digital circuitry 1014 that corresponds to the analog value output by amplifier 1010, which in turn corresponds to the combined differential capacitance, which in turn corresponds to the movement of the one or more proof mass electrodes relative to the fixed electrodes in response to linear acceleration with compensation for out-of-plane movement. The digital circuitry 1014 may perform functions such as scaling and analysis to output linear acceleration or parameters that may be derived from linear acceleration, which output may be provided to software 1016 for further analysis, such as further scaling and analysis.

Figure 11:
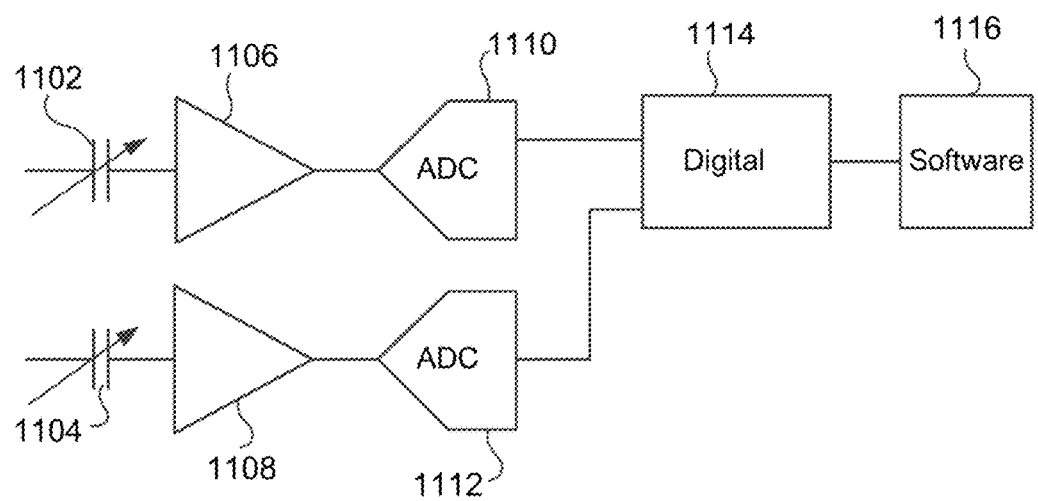
FIG. 11 depicts exemplary processing circuitry for performing movement compensation in accordance with some embodiments of the present disclosure.

FIG. 11 depicts exemplary processing circuitry for performing movement compensation in accordance with some embodiments of the present disclosure. In the embodiment of FIG. 11, a sensing differential capacitor 1102 output has an effective capacitance that is proportional to the movement of one or more proof mass electrodes relative to one or more fixed electrodes in response to an inertial force (e.g., linear acceleration) that is desired to be measured. A compensation differential capacitor 1104 output has an effective capacitance that is proportional to the movement of one or more portions of a MEMS layer (e.g., proof mass electrodes and/or fixed electrodes) relative to one or more auxiliary electrodes (e.g., out-of-plane movement relative to auxiliary electrodes located on a substrate plane). The sense differential capacitor 1102 output is provided to C2V circuit 1106, which may provide scaling and amplification, and outputs a signal (e.g., a current or voltage) that is proportional to the effective capacitance of the sense differential output signal. The compensation differential capacitor 1104 output is provided to C2V circuit 1108, which may provide scaling and amplification, and outputs a signal (e.g., a current or voltage) that is proportional to the effective capacitance of the compensation differential output signal. The output of C2V circuit 1106 is provided to analog to digital converter 1110, which outputs digital data to digital circuitry 1114 that corresponds to the analog value output by C2V circuit 1106, which in turn corresponds to the movement of the one or more proof mass electrodes relative to the fixed electrodes in response to linear acceleration. The output of C2V circuit 1108 is provided to analog to digital converter 1112, which outputs digital data to digital circuitry 1114 that corresponds to the analog value output by C2V circuit 1108, which in turn corresponds to the movement of a portion of the MEMS layer (e.g., out-of-plane movement) relative to an auxiliary electrode. The digital circuitry 1114 receives the digital signals from analog to digital converter 1110 and analog to digital converter 1112 and performs digital operations (e.g., subtraction and scaling) to determine a combined signal representative of compensated linear acceleration. Digital circuitry 1114 may also perform functions such as scaling and analysis to output linear acceleration or parameters that may be derived from linear acceleration, which output may be provided to software 1116 for further analysis, such as further scaling and analysis.

Figure 12:
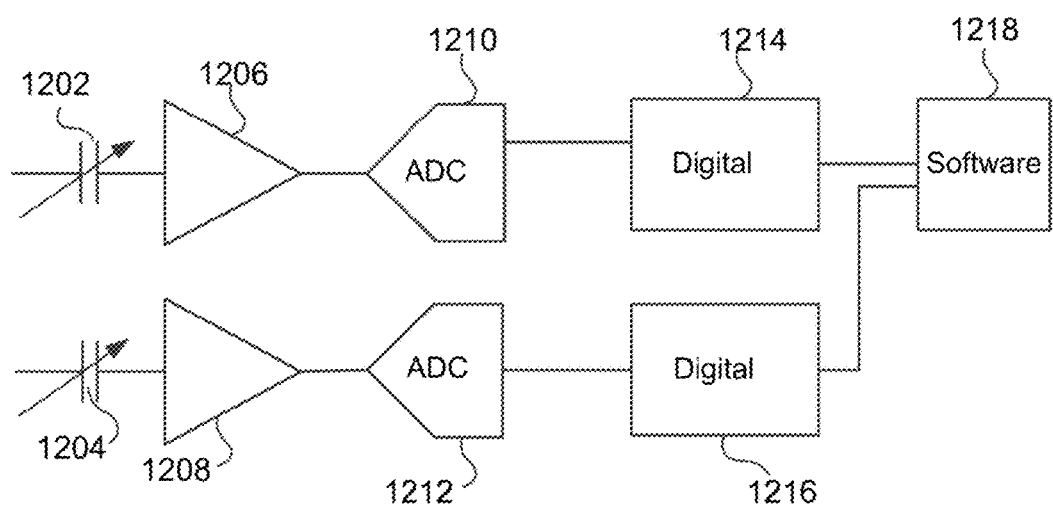
FIG. 12 depicts exemplary processing circuitry for performing movement compensation in accordance with some embodiments of the present disclosure.

FIG. 12 depicts exemplary processing circuitry for performing movement compensation in accordance with some embodiments of the present disclosure. In the embodiment of FIG. 12, a sensing differential capacitor 1202 output has an effective capacitance that is proportional to the movement of one or more proof mass electrodes relative to one or more fixed electrodes in response to an inertial force (e.g., linear acceleration) that is desired to be measured. A compensation differential capacitor 1204 output has an effective capacitance that is proportional to the movement of one or more portions of a MEMS layer (e.g., proof mass electrodes and/or fixed electrodes) relative to one or more auxiliary electrodes (e.g., out-of-plane movement relative to auxiliary electrodes located on a substrate plane). The sense differential capacitor 1202 output is provided to C2V circuit 1206, which may provide scaling and amplification, and outputs a signal (e.g., a current or voltage) that is proportional to the effective capacitance of the sense differential output signal. The compensation differential capacitor 1204 output is provided to C2V circuit 1208, which may provide scaling and amplification, and outputs a signal (e.g., a current or voltage) that is proportional to the effective capacitance of the compensation differential output signal. The output of C2V circuit 1206 is provided to analog to digital converter 1210, which outputs digital data to digital circuitry 1214 that corresponds to the analog value output by C2V circuit 1206, which in turn corresponds to the movement of the one or more proof mass electrodes relative to the fixed electrodes in response to linear acceleration. The output of C2V circuit 1208 is provided to analog to digital converter 1212, which outputs digital data to digital circuitry 1216 that corresponds to the analog value output by C2V circuit 1208, which in turn corresponds to the movement of a portion of the MEMS layer (e.g., out-of-plane movement) relative to an auxiliary electrode. The digital circuitry 1214 receives the digital signal from analog to digital converter 1210 to determine a sense signal representative of linear acceleration by performing functions such as scaling and analysis to output linear acceleration or parameters that may be derived from linear acceleration, which output may be provided to software 1218. The digital circuitry 1216 receives the digital signal from analog to digital converter 1212 to determine a compensation signal representative of out-of-plane movement by performing functions such as scaling and analysis to output linear acceleration or parameters that may be derived from linear acceleration, which output may be provided to software 1218. The software 1218 receives the outputs from digital circuitry 1214 and digital circuitry 1216, and performs software operations (e.g., subtraction and scaling) to determine a combined signal representative of compensated linear acceleration, and may further perform additional analysis and scaling.

Figure 13:
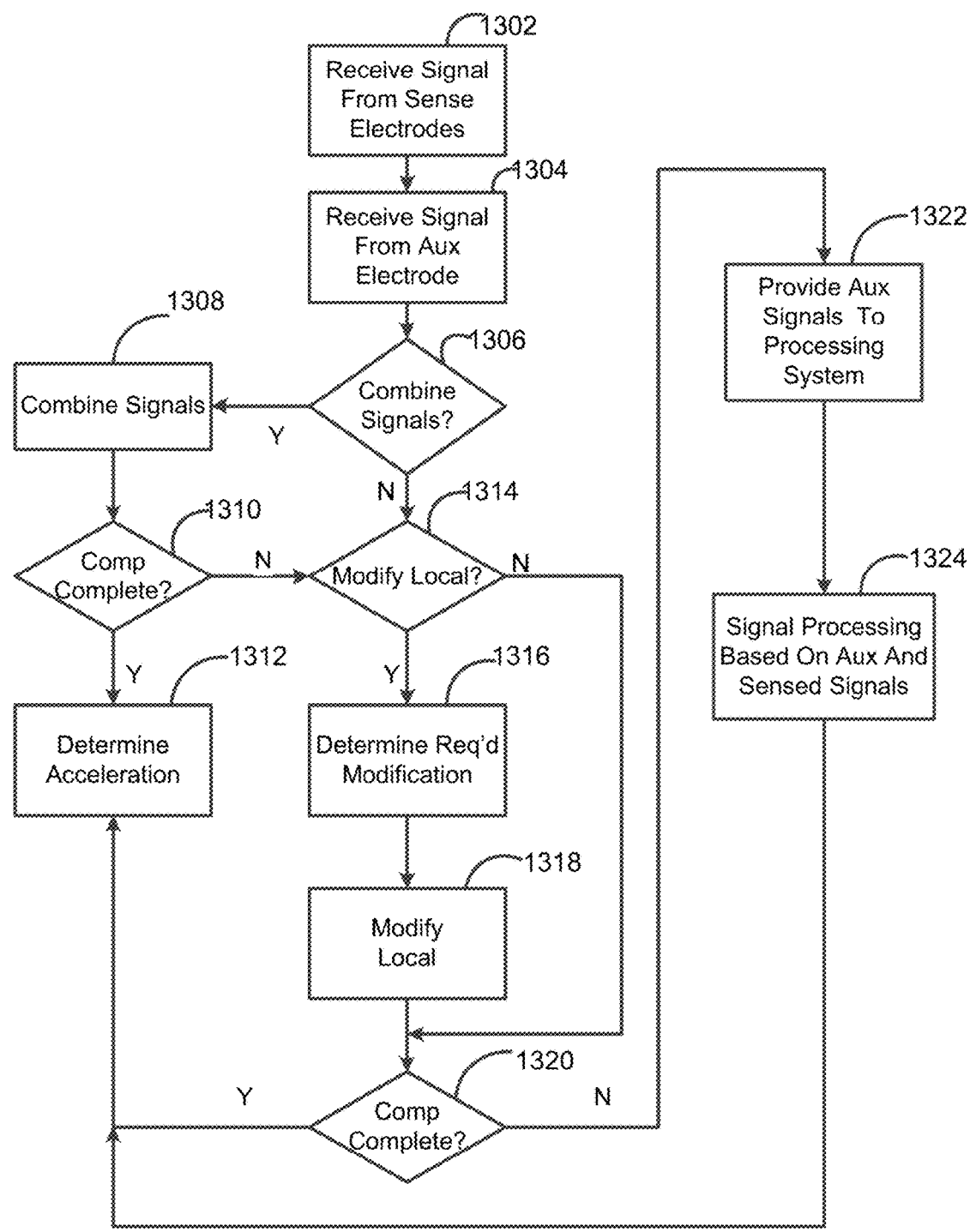
FIG. 13 depicts exemplary steps for a method of performing movement compensation in accordance with some embodiments of the present disclosure.

FIG. 13 depicts exemplary steps for a method of performing movement compensation in accordance with some embodiments of the present disclosure. Although FIG. 13 is described in the context of the particular accelerometer of the present disclosure, it will be understood that the designs, components, configurations, methods, and steps described herein and in FIG. 13 may be applied to a variety of suitable accelerometers and other MEMS sensors that utilize in-plane sensing and experience out-of-plane movement, including inertial sensors such as gyroscopes. Although a particular order and flow of steps is depicted in FIG. 13, it will be understood that in some embodiments one or more of the steps may be modified, moved, removed, or added, and that the flow depicted in FIG. 13 may be modified.

At step 1302, signals may be received from fixed and/or proof-mass electrodes, e.g., fixed electrodes based on an overall capacitance relative to proof-mass electrodes and potentials provided thereto. The capacitances may be based on sizes of each of the fixed and proof-mass electrodes and a distance therebetween. As described herein, in some embodiments, sense signals may be received from multiple fixed electrodes. In some embodiments, a sense signal may include received signals and/or a differential signal generated therefrom. Once the sense signal(s) is received, processing may continue to step 1304. Steps 1302 and 1304 are shown sequentially for clarity, but may in fact take place simultaneously.

At step 1304, one or more signals may be received from auxiliary electrodes. A potential may also be provided to the auxiliary electrodes to facilitate receiving the signal. As described herein, the received signals may be representative of a capacitance between each auxiliary electrode (or a combination thereof) and a portion of the MEMS layer, and potentials provided thereto, wherein the capacitance changes based on a moving of the MEMS layer or a component thereof out of plane towards or away from a respective auxiliary electrode. Once the one or more signals are received from the auxiliary electrodes, processing may continue to step 1306.

At step 1306, it may be determined whether to combine the sensed signals and the auxiliary signals. If the signals are not to be combined, processing may continue to step 1314. In embodiments, the signals may be combined directly (i.e., a physical connection resulting in a common signal representative of combined capacitance), by circuitry that directly combines the signals, such as is described in FIG. 9 herein. If the signals are to be combined, processing may continue to step 1308 where the combination is performed, and from there to step 1310. At step 1310 if the combination of signals is the only compensation to be performed, processing may continue to step 1312 and acceleration may be determined. If additional compensation is to be performed, processing may continue to step 1314.

At step 1314, it may be determined whether the sense signal (e.g., a differential sense signal) or sense signals are to be modified locally (i.e., within the processing circuit 14, e.g., by analog and/or digital circuitry at the MEMS sensor such as by an ASIC, other than by direct combination of the received charge signals) based on the one or more auxiliary signals, such as is described in FIGS. 10 and/or 11 herein. If a local modification is not to be performed, processing may continue to step 1320. If a local modification is to be performed, processing may continue to step 1318 at which the compensation techniques (e.g., analog and/or digital compensation, and in some embodiments, modification of scaling factors, etc.) may be applied to the sense signal or signals based on the auxiliary signals. Processing may then continue to step 1320, at which it is determined whether compensation is complete after the modification. If compensation is complete, processing may continue to step 1312 at which acceleration is determined based on the modified sense signal. If compensation is not complete, processing may continue to step 1322.

At step 1322, the one or more auxiliary signals may be provided to a processing system such as a processor of processing circuitry 14, a microprocessor that is a component of a MPU, or other similar processing device. Once the one or more auxiliary processing signals are provided to the processing system, processing may continue to step 1324, at which additional processing may be performed based on the auxiliary and/or other signals in order to perform compensation, for example, as is described in FIG. 12 herein. Once compensation has been performed, processing may continue to step 1312 at which acceleration may be determined based on the compensated sense signal.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) device, comprising:
    a substrate layer having a substrate plane;
    a MEMS layer including a suspended spring-mass system and having an upper plane and a lower plane, the lower plane being located above the substrate plane;
    a plurality of fixed electrodes, wherein each of the plurality of fixed electrodes is at least partially located within the MEMS layer and has an upper plane and a lower plane, wherein the suspended spring-mass system moves relative to the plurality of fixed electrodes in response to a first force in a first direction, wherein the suspended spring-mass system moves relative to the substrate in response to a second force in a second direction, wherein a first proportional movement in response to a first value of the first force is larger than a second proportional movement in response to a second value of the second force when the first value and the second value are equivalent, and wherein either the suspended spring-mass system or the plurality of fixed electrodes outputs a sense signal in response to the first force and the second force; and
    a plurality of auxiliary electrodes located on the substrate layer facing the lower plane of the suspended spring-mass system or one or more of the fixed electrodes, wherein a plurality of auxiliary electrical signals from the auxiliary electrodes provide compensation for the second force, and wherein an output signal representative of the first force is based on the sense signal and the compensation.

2. The MEMS device of claim 1, wherein the first value of the first force and the second value of the second force are experienced at different times during operation of the MEMS device.

3. The MEMS device of claim 1, wherein the first proportional movement is at least an order of magnitude larger than the second proportional movement when the first value and the second value are equivalent.

4. The MEMS device of claim 1, wherein the movement in the first direction is along an axis that is substantially normal to a facing portion of each of the fixed electrodes, and the movement in the second direction is along an axis that is substantially perpendicular to the first direction.

5. The MEMS device of claim 1, wherein the movement in the second direction is substantially different from the movement in the first direction.

6. The MEMS device of claim 1, wherein the auxiliary signal results in compensation for the movement in the second direction when the auxiliary signal crosses a threshold, wherein the threshold corresponds to the movement in the second direction causing a modification of the sense signal compared to operating conditions without the movement in the second direction.

7. The MEMS device of claim 1, wherein a first portion of the suspended spring-mass system is situated closer than parallel to the substrate plane due to the movement in the second direction and a second portion of the suspended spring-mass system is situated farther than parallel from the substrate plane based on the movement in the second direction, wherein the first portion has a decreased capacitance with a first one or more of the fixed electrodes than when parallel to the substrate plane and wherein the second portion has an increased capacitance with a second one or more of the fixed electrodes than when parallel to the substrate plane.

8. The MEMS device of claim 7, wherein a first auxiliary electrode of the plurality of auxiliary electrodes is associated with the first portion and experiences an increased capacitance with the first portion based on the movement in the second direction and wherein a second auxiliary electrode of the plurality of auxiliary electrodes is associated with the second portion and experiences a decreased capacitance with the second portion based on the movement in the second direction.

9. The MEMS device of claim 8, wherein the increased capacitance of the first auxiliary electrode with the first portion is proportional to the decreased capacitance of the first portion with the first one or more fixed electrodes, and wherein the decreased capacitance of the second auxiliary electrode with the second portion is proportional to the increased capacitance of the second portion with the second one or more fixed electrodes.

10. The MEMS device of claim 1, wherein the compensation for the movement in the second direction is based on an analog modification of the output signal based on the auxiliary signal.

11. The MEMS device of claim 1, wherein the compensation for the movement in the second direction is based on a digital modification of the output signal based on the auxiliary signal.

12. The MEMS device of claim 1, further comprising one or more compensation electrodes located on the substrate layer facing the lower plane of the suspended spring-mass system, wherein the compensation electrodes are separate from the auxiliary electrodes, and wherein the compensation for the movement in the second direction is performed by the compensation electrodes based on the auxiliary signal.

13. The MEMS device of claim 12, wherein the compensation electrodes apply a capacitive force to the suspended spring mass system based on the auxiliary signal.

14. The MEMS device of claim 1, wherein the first force comprises a linear acceleration.

15. The MEMS device of claim 1, wherein the MEMS device comprises a magnetic field sensor.

16. A microelectromechanical (MEMS) device, comprising:
a plurality of movable electrodes of a MEMS layer;
a plurality of fixed electrodes, wherein each of the plurality of movable electrodes is located adjacent to at least one of the plurality of fixed electrodes in at least a portion of the MEMS layer, wherein the movable electrodes move within the MEMS layer relative to the plurality of fixed electrodes in response to a first force in a first direction, wherein the movable electrodes move outside of the MEMS layer in response to a second force in a second direction, wherein the plurality of fixed electrodes or the plurality of movable electrodes output a sense signal in response to at least the movement in the first direction, and wherein a first proportional movement in response to a first value of the first force is larger than a second proportional movement in response to a second value of the second force when the first value and the second value are equivalent; and
a plurality of auxiliary electrodes located on a substrate layer facing a lower plane of the movable electrodes or one or more of the fixed electrodes, wherein the lower plane of the movable electrodes has moved with respect to a facing surface of the auxiliary electrodes, wherein an auxiliary signal from the auxiliary electrodes provides compensation for the movement in the second direction, and wherein an output signal representative of the first force is based on the sense signal and the compensation.

17. A microelectromechanical (MEMS) device, comprising:
a substrate layer having a substrate plane;
a MEMS layer including a suspended spring-mass system and having an upper plane and a lower plane, the lower plane being located above the substrate plane;
a plurality of fixed electrodes, wherein each of the plurality of fixed electrodes is at least partially located within the MEMS layer and has an upper plane and a lower plane, wherein the suspended spring-mass system moves relative to the plurality of fixed electrodes in response to a first force in a first direction, wherein the first force comprises a linear acceleration, wherein the suspended spring-mass system moves relative to the substrate in response to a second force in a second direction, and wherein either the suspended spring-mass system or the plurality of fixed electrodes outputs a sense signal in response to the first force and the second force; and
a plurality of auxiliary electrodes located on the substrate layer facing the lower plane of the suspended spring-mass system or one or more of the fixed electrodes, wherein a plurality of auxiliary electrical signals from the auxiliary electrodes provide compensation for the second force, and wherein an output signal representative of the first force is based on the sense signal and the compensation.

18. The MEMS device of claim 17, wherein a first proportional movement in response to a first value of the first force is larger than a second proportional movement in response to a second value of the second force when the first value and the second value are equivalent.

19. The MEMS device of claim 18, wherein the first value of the first force and the second value of the second force are experienced at different times during operation of the MEMS device.

20. The MEMS device of claim 18, wherein the first proportional movement is at least an order of magnitude larger than the second proportional movement when the first value and the second value are equivalent.

21. The MEMS device of claim 17, wherein the movement in the first direction is along an axis that is substantially normal to a facing portion of each of the fixed electrodes, and the movement in the second direction is along an axis that is substantially perpendicular to the first direction.

22. The MEMS device of claim 17, wherein the movement in the second direction is substantially different from the movement in the first direction.

23. The MEMS device of claim 17, wherein the auxiliary signal results in compensation for the movement in the second direction when the auxiliary signal crosses a threshold, wherein the threshold corresponds to the movement in the second direction causing a modification of the sense signal compared to operating conditions without the movement in the second direction.

24. The MEMS device of claim 17, wherein a first portion of the suspended spring-mass system is situated closer than parallel to the substrate plane due to the movement in the second direction and a second portion of the suspended spring-mass system is situated farther than parallel from the substrate plane based on the movement in the second direction, wherein the first portion has a decreased capacitance with a first one or more of the fixed electrodes than when parallel to the substrate plane and wherein the second portion has an increased capacitance with a second one or more of the fixed electrodes than when parallel to the substrate plane.

25. The MEMS device of claim 24, wherein a first auxiliary electrode of the plurality of auxiliary electrodes is associated with the first portion and experiences an increased capacitance with the first portion based on the movement in the second direction and wherein a second auxiliary electrode of the plurality of auxiliary electrodes is associated with the second portion and experiences a decreased capacitance with the second portion based on the movement in the second direction.

26. The MEMS device of claim 25, wherein the increased capacitance of the first auxiliary electrode with the first portion is proportional to the decreased capacitance of the first portion with the first one or more fixed electrodes, and wherein the decreased capacitance of the second auxiliary electrode with the second portion is proportional to the increased capacitance of the second portion with the second one or more fixed electrodes.

27. The MEMS device of claim 17, wherein the compensation for the movement in the second direction is based on an analog modification of the output signal based on the auxiliary signal.

28. The MEMS device of claim 17, wherein the compensation for the movement in the second direction is based on a digital modification of the output signal based on the auxiliary signal.

29. The MEMS device of claim 17, further comprising one or more compensation electrodes located on the substrate layer facing the lower plane of the suspended spring-mass system, wherein the compensation electrodes are separate from the auxiliary electrodes, and wherein the compensation for the movement in the second direction is performed by the compensation electrodes based on the auxiliary signal.

30. The MEMS device of claim 29, wherein the compensation electrodes apply a capacitive force to the suspended spring mass system based on the auxiliary signal.

* * * * *